June 28, 1966 C. R. BATTJES 3,258,765
DIGITAL TO ANALOG CONVERTER
Filed Jan. 23, 1963
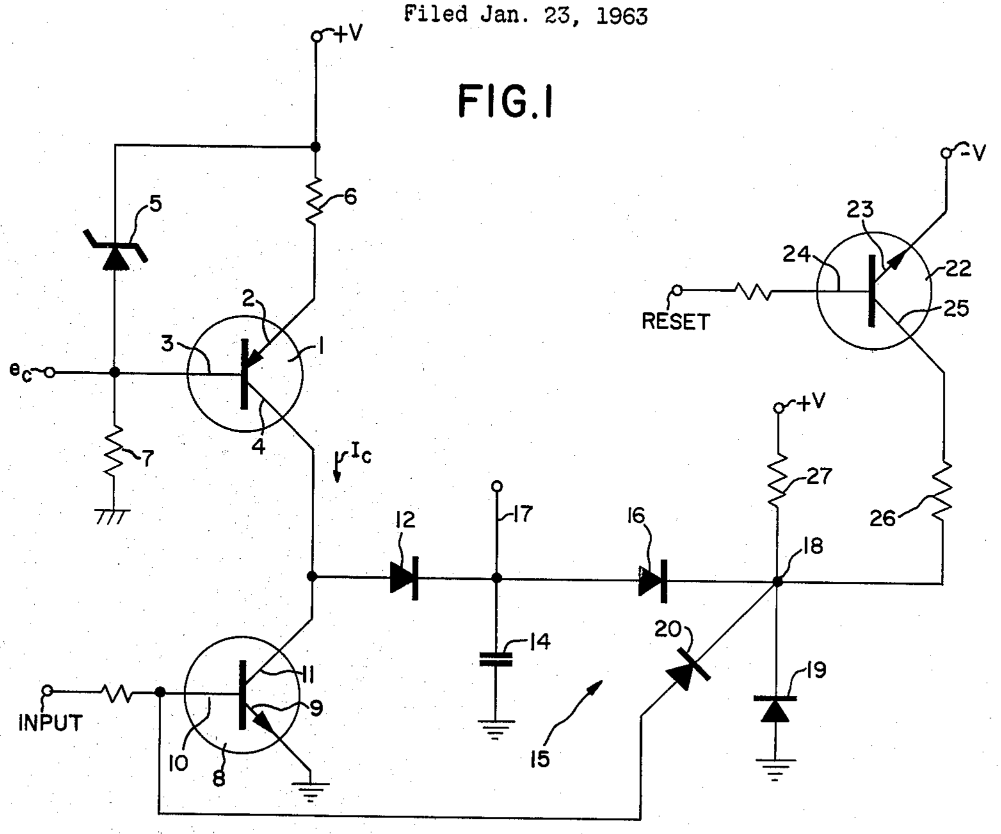
FIG. 1
FIG. 2
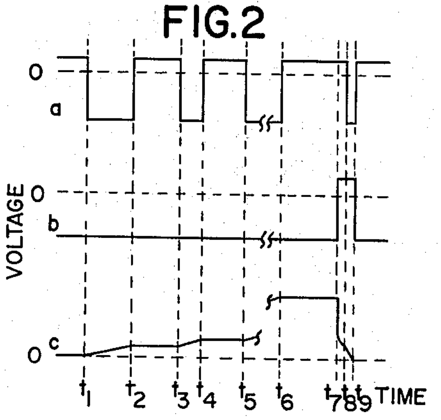
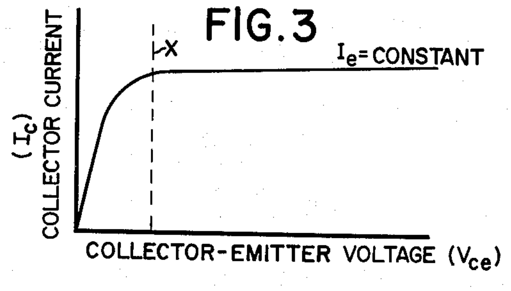
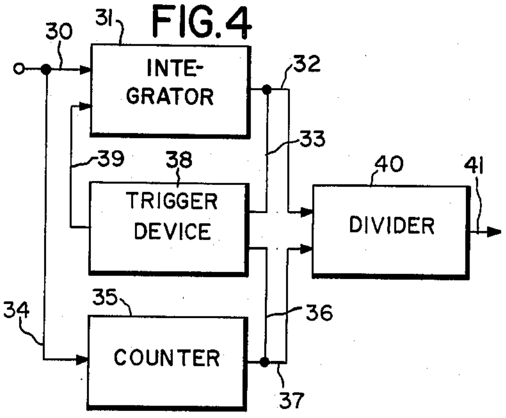
INVENTOR.
CARL R. BATTJES
BY John [signature]
ATTORNEY

United States Patent Office 3,258,765

Patented June 28, 1966

3,258,765

DIGITAL TO ANALOG CONVERTER

Carl R. Battjes, Portland, Oreg., assignor to Sylvania Electric Products Inc., a corporation of Delaware Filed Jan. 23, 1963, Ser. No. 253,389

4 Claims. (Cl. 340—347)

This invention relates to integrating circuits and more particularly to an integrating circuit providing linear and accurate conversion of a digital input to an analog output.

Integration of a digital input signal may be obtained by charging an integrating capacitor from a constant current source. The capacitor is normally discharged through a switching device at an exponential rate determined by the RC time constant of the discharge path. When a digital input signal is integrated over a time interval wherein there are integration periods and hold periods, inaccuracies may be obtained in the output during a hold period due to leakage of the charge stored on the integrating capacitor through the switching device and constant current source. It is necessary to discharge the capacitor and reset the circuit for another integrating period in the shortest possible time interval in order to have minimum information loss and maximum accuracy of conversion of the input signal.

A primary object of this invention is the provision of a linear and accurate integrator circuit wherein leakage currents through the switching device and current source are minimized.

Another object is the provision of a solid state integrator circuit having rapid reset of the integrating capacitor through the use of a reset diode.

In accordance with this invention, a constant current source charges an integrating capacitor through an isolation diode during alternate half cycles of a digital input signal. When the capacitor is not being charged, the diode isolates the capacitor from the current source to prevent charge leaking onto or from the capacitor, thus providing an accurate analog indication of the digital input signal. Reset of the integrator circuit is initiated when a second isolation diode is caused to conduct to initiate discharge of the capacitor through the diode. The isolation diode resistance increases as the discharge current decreases and causes the discharge transient of the circuit to increase and the capacitor to discharge more slowly. A reset or control diode conducts when the charge on the capacitor reaches a predetermined level and forces the current source to conduct through the isolation diodes to decrease the diode resistance and force the capacitor to discharge more rapidly to an equilibrium potential.

The foregoing and other objects and the operation of this invention will be more fully understood from the following description of a preferred embodiment thereof, reference being made to the accompanying drawings in which:

FIGURE 1 is a schematic diagram of an integrator circuit embodying the invention;

FIGURE 2 is a set of wave forms *a*, *b*, and *c* illustrating the operation of the circuit of FIGURE 1, wherein Waveform *a* is the digital input applied to base 10 of switching transistor 8, Waveform *b* is the input signal to base 24 of switching transistor 22, and Waveform *c* is the signal developed across integrating capacitor 14;

FIGURE 3 is a plot of collector-emitter voltage and collector current for transistor amplifier 1; and FIGURE 4 is a block diagram of a system employing the integrator circuit of FIGURE 1.

Referring to FIGURE 1, transistor 1 is operated as a constant current source. In order to maintain a constant charging current for the capacitor 14, a Zener diode 5 is employed to bias the transistor. The anode of Zener diode 5 is electrically connected to base 3 of the transistor and through a bias resistor 7 to ground. The cathode of the Zener diode is electrically connected to a supply potential +V and through an emitter bias resistor 6 to emitter 2. Collector 4 of current source 1 is connected to the anode of normally cutoff blocking diode 12 and to collector 11 of normally conducting switching transistor 8. The cathode of blocking diode 12 is connected to one plate of integrating capacitor 14 and to the anode of isolation diode 16. The other plate of the capacitor is connected to ground. The input signal is applied to base 10 of transistor 8.

The integration cycle is performed by constant current source 1, switching transistor 8, blocking diode 12 and integrating capacitor 14. During the integration cycle, isolator diode 16 disconnects the integrating capacitor from a reset circuit 15 which is described below.

Reset circuit 15 comprises isolation diode 16, catching diode 19, reset diode 20 and switching transistor 22. The reset cycle is initiated by applying an input pulse to base 24 of switching transistor 22. Emitter 23 of the transistor is connected to the negative supply potential. Collector 25 is connected through current limiting resistor 26 and junction 18 to the cathodes of isolation diode 16, catching diode 19 and reset diode 20. A positive potential V is applied from a source through bias resistor 27, junction 18 and current limiting resistor 26 to collector 25. The anode of catching diode 19 is connected to ground. The anode of reset diode 20 is connected to base 10 of switching transistor 8. The output signal developed across integrating capacitor 14 is taken from line 17 through a high impedance output circuit.

The waveforms of FIGURE 2 illustrate the operation of the circuit of FIGURE 1. During the negative portion of the input signal, times $t_1$ to $t_2$, $t_3$ to $t_4$, . . . switching transistor 8 is cut off, blocking diode 12 conducts and capacitor 14 charges. During the positive portions of the input signal, times $t_2$ to $t_3$, $t_4$ to $t_5$, . . . the charge is stored on the capacitor. The reset cycle is initiated at time $t_7$ upon receipt of the input signal to base 24 of switching transistor 22. At time $t_8$, reset diode 20 is forward biased by the change in the junction 18 potential and conducts and cuts off switching transistor 8 forcing the charging current from constant current source 1 to flow through blocking diode 12 and isolator diode 16 to reduce the impedance of diode 16 and therefore reduce the time to reach an equilibrium potential. The reset cycle is terminated at time $t_9$ by the removal of the input signal to base 24 of transistor 22 when the potential on capacitor 14 reaches an equilibrium value.

This invention will be more clearly understood from a detailed description of the operation of the circuit of FIGURE 1.

A constant potential is maintained between the supply voltage +V and base 3 of transistor 1 by Zener diode 5. The emitter current of the transistor is $$I_e = \frac{V_z - v_{eb}}{R_e} \qquad (1)$$

where $V_z$ is the potential across Zener diode 5, $V_{eb}$ is the emitter-base potential, and $R_e$ is emitter bias resistor 6. The charging current or collector current $I_c$ is $$I_c = \frac{V - v_{eb} - e_c}{R_e}\alpha \qquad (2)$$

$$= \frac{V_z - v_{eb}}{R_e}\alpha \qquad (3)$$

where V is the supply potential, $\alpha$ is the current gain of the transistor, and $e_c$ is the base potential. As the current gain $\alpha$ and the emitter-base potential $V_{eb}$ are relatively insensitive to changes in collector potential, and as changes in the emitter-base potential are much less than the constant Zener voltage $V_z$, the collector potential may be subjected to large variations while maintaining the collector current approximately constant. Transistor amplifier 1 therefore acts as a constant current source although the charge on the capacitor, and thus the potential on collector 4, is continually changing during the integration period.

When the circuit is in its quiescent state, prior to the application of an input signal to be integrated, a positive potential is applied to base 10 of switching transistor 8 to maintain the transistor in its conduction state. Blocking diode 12 is cut off due to the potential developed across the diode. Base 24 of switching transistor 22 is reverse biased and the transistor is cut off. Isolation diode 16, catching diode 19 and reset diode 20 are reverse biased and cut off due to the positive supply potential applied to their respective cathodes.

The digital input to be integrated is applied to base 10 of switching transistor 8 and is clamped to and does not exceed the positive forward bias potential on the base of the transistor. When the digital input goes negative, at time $t_1$ of waveform *a*, switching transistor 8 is reverse biased and is cut off, and blocking diode 12 conducts. As isolation diode 16 is cut off due to its positive cathode potential, the charging current $I_c$ is diverted through and charges capacitor 14 at a linear rate to produce an analog output that is proportional to the digital input to base 10 of transistor 8, waveform *c*, time $t_1$ to $t_2$. The integration cycle is terminated at time $t_2$ of FIGURE 2 when the potential on base 10 of transistor 8 returns to the positive bias potential causing transistor 8 to conduct, reverse biasing and cutting off blocking diode 12 and passing the charging current $I_c$ through transistor 8 to ground.

During the hold period, time $t_2$ to $t_3$ of FIGURE 2, switching transistor 8 is forward biased and conducts, maintaining blocking diode 12 in its cutoff state. Switching transistor 22 is reverse biased and is cut off during this time interval, maintaining isolation diode 16, catching diode 19 and reset diode 20 in their cutoff state. Blocking diode 12 and isolation diode 16 preferably have essentially zero leakage currents and, for example, may be diode 1N914 manufactured by Sylvania Electric Products, Inc. Thus, the charge on the capacitor is held constant during the period $t_2$ to $t_3$, as shown in waveform *c* to enable one to obtain an accurate analog indication of a digital input taken over a time interval such as time $t_1$ to $t_7$ of waveform *c*. Other integration cycles similar to that described above, $t_1$ to $t_3$ of waveforms *a* and *c*, are initiated upon application of successive negative going input pulses to base 10 of transistor 8.

Reset of the integrating circuit and discharge of integrating capacitor 14 are initiated at time $t_7$ of waveform *b* by the application of a positive pulse to base 24 of switching transistor 22. The transistor is forward biased and conducts causing the potential of junction 18 to fall rapidly toward the negative supply potential —V. When the junction potential becomes less positive than the potential on the capacitor, isolation diode 16 conducts and initiates discharge of the capacitor through switching transistor 22. The rate at which the capacitor discharges is proportional to the RC time constant of the discharge path and is determined by the isolation diode resistance, current limiting resistor 26, the collector-emitter resistance of switching transistor 22 and capacitor 14. As the diode impedance is inversely proportional to the diode current, the resistance of isolation diode 16 gradually increases as the charge stored on the capacitor, and thus the current through the diode, decreases. Thus, the value of the RC time constant of the discharge path of capacitor 14 gradually increases and the capacitor discharges toward an equilibrium value more and more slowly.

When the junction 18 potential falls below a predetermined potential such as ground at time $t_8$ in FIGURE 2, catching diode 19 and reset diode 20 conduct. Catching diode 19 maintains the junction potential constant at approximately ground. The conduction of reset diode 20 causes the potential of base 10 of switching transistor 8 to fall to approximately ground and cuts off the transistor. Blocking diode 12 conducts and passes the charging current through isolation diode 16. The increased current flow through the isolation diode causes the diode resistance and the RC time constant of the discharge transient to decrease, and the capacitor discharges rapidly to equilibrium.

The reset cycle is terminated, at time $t_9$ of FIGURE 2, by the termination of the input pulse to base 24 of switching transistor 22. The transistor is cut off and the junction 18 potential rapidly increases to the positive supply potential causing isolation diode 16, catching diode 19 and reset diode 20 to cut off. The cutoff of reset diode 20 removes the reverse bias on switching transistor 8 causing it to conduct, to cut off blocking diode 12, and to pass the charging current to ground. The circuit is now reset and is ready to go through another integration cycle.

A system wherein the integrator circuit of this invention is employed to produce an output that is an indication of the average pulsewidth of the digital input signal as a function of a specific number of input pulses is illustrated in the circuit of FIGURE 4.

A digital input is applied simultaneously on line 30 to integrator 31 and on line 34 to counter 35. The analog output produced by integrator 31 is proportional to the digital input, as illustrated in waveform *c*, and is applied through line 32 to divider 40. A unit count is recorded by counter 35 when the polarity of the digital input signal changes, for example, from a "zero" to a "one." When a particular count is obtained, an output is produced simultaneously on lines 36 and 37. The output on line 36 causes trigger device 38 to conduct and to produce an output pulse (see waveform *b*) on line 39 to reset integrator 31. Trigger device 38 is reverse biased and is cut off in order to terminate the reset cycle when the charge on the integrator capacitor reaches its equilibrium value, as indicated by the output of the integrator taken on line 33. The output of counter 35 is applied through line 37 to divider 40 to initiate division of the analog output of integrator 31 to produce an output on line 41 that is an indication of the average width of the pulses of a digital input signal or train of pulses having pulse width and/or pulse repetition rate variation.

While the invention has been described in relation to specific embodiments, modifications thereof will become apparent to those skilled in the art. For example, the base 3 of transistor 1 or the side of bias resistor 6 farthest from emitter 2 may be driven from a variable voltage source, eliminating the need for the Zener diode circuit, to obtain a weighted integration by charging the capacitor at a different rate depending on the time a particular input occurs during the integration cycle. It is therefore to be understood that the scope of this invention is not limited to the embodiments described herein, but is defined by the appended claims.

What is claimed is:

1. A digital to analog converter comprising a capacitor having one side electrically connected to a reference potential, a source of constant current having an output terminal, a first diode electrically connecting said output terminal to the other side of said capacitor, a first electronic switch having one side electrically connected to said reference potential and having another side electrically connected to said output terminal, said switch having an input terminal and being operative in a first state to by-pass the output of said source and in a second state to forward bias said diode whereby to apply the output of said source to said capacitor, a reset circuit for said capacitor comprising, a second diode having one side electrically connected to said other side of the capacitor, and a second electronic switch electrically connected to the other side of said second diode and operative to change the bias on the second diode for discharging the capacitor, and means responsive to the operation of the second switch for applying a voltage to the input terminal of the first switch to actuate the latter to cause the constant current source to conduct through said second diode.

2. A digital to analog converter comprising a capacitor having one side electrically connected to a reference potential, a constant current source, a switch, means for applying a digital input to the switch, said switch being responsive to said digital input for electrically connecting and disconnecting the other side of said capacitor to and from said source whereby a charge corresponding to the integral of the digital input is developed on said capacitor, a reset circuit comprising, a diode having one side electrically connected to said other side of the capacitor, means for reverse biasing said diode, another switch connected to the other side of said diode, and said last named switch being responsive to a reset signal for simultaneously changing the bias on said diode whereby said capacitor discharges, and means responsive to the operation of the last named switch for operating the first named switch to cause said constant current source to conduct through said diode.

3. A digital to analog converter comprising an integrator capacitor, a constant current source comprising a first transistor having base, emitter, and collector electrodes, a constant voltage source electrically connected to said base electrode, and means electrically connected between said base and emitter electrodes to maintain a constant potential therebetween, a first isolation diode electrically connected between one side of said capacitor and said collector electrode, a second transistor having base, emitter, and collector electrodes, the collector electrodes of said first and second transistors being electrically connected together and to said isolation diode, means for applying an input to the base electrode of said second transistor, a third transistor having base, emitter, and collector electrodes, the collector electrode of said third transistor being electrically connected to a voltage source, means for applying an input to the base electrode of said third transistor, a second isolation diode electrically connected between said one side of the capacitor and the collector electrode of said third transistor, a catching diode electrically connected between the collector electrode of said third transistor and a reference potential, a control diode electrically connected between the collector electrode of said third transistor and the base electrode of said second transistor, means to electrically connect the other side of said integrating capacitor to said reference potential, means to electrically connect said first transistor emitter electrode to a voltage source, means to electrically connect said second transistor emitter electrode to a reference potential, and means to electrically connect said third transistor emitter electrode to a voltage source.

4. A digital to analog converter comprising an integrator capacitor, a constant current source, first switching means electrically connected between the current source and one side of said integrator capacitor, means to apply an input signal to said first switching means, said switching means being adapted to isolate the capacitor from external circuitry when not charging and to cause said current source to conduct through the capacitor in response to said input signal, second switching means electrically connected to said one side of the integrator capacitor to discharge said capacitor in response to an input signal, means to apply an input signal to said second switching means, control means electrically connected between said second switching means and said first switching means and responsive to the operation of the second switching means to increase the speed of discharge of said capacitor, and means to electrically connect the other side of said capacitor to a reference potential.

References Cited by the Examiner

UNITED STATES PATENTS

| | | | |
|---|---|---|---|
| 3,056,047 | 9/1962 | Yarborough | 307—88.5 |
| 3,064,144 | 11/1962 | Hardy | 307—88.5 |

DARYL W. COOK, *Acting Primary Examiner.*

MALCOLM A. MORRISON, *Examiner.*

K. R. STEVENS, *Assistant Examiner.*